(12) United States Patent
Hong et al.

(10) Patent No.: US 7,972,941 B2
(45) Date of Patent: Jul. 5, 2011

(54) METHOD OF MANUFACTURING A SEMICONDUCTOR DEVICE

(75) Inventors: Jong-Won Hong, Gyeonggi-do (KR); Gil-Heyun Choi, Seoul (KR); Jong-Myeong Lee, Gyeonggi-do (KR); Geum-Jung Seong, Seoul (KR)

(73) Assignee: Samsung Electronics Co., Ltd. (KR)

( * ) Notice: Subject to any disclaimer, the term of this patent is extended or adjusted under 35 U.S.C. 154(b) by 165 days.

(21) Appl. No.: 12/165,805

(22) Filed: Jul. 1, 2008

(65) Prior Publication Data

US 2009/0011583 A1 Jan. 8, 2009

(30) Foreign Application Priority Data

Jul. 2, 2007 (KR) .................. 10-2007-0066111

(51) Int. Cl.
*H01L 21/322* (2006.01)
(52) U.S. Cl. ........ 438/475; 438/311; 438/672; 438/687; 257/E21.006; 257/E21.054; 257/E21.077; 257/E21.058; 257/E21.267; 257/E21.278; 257/E21.293; 257/E21.311; 257/E21.319; 257/E21.646
(58) Field of Classification Search .......... 438/475, 438/474, 238, 381, 311, 680, 688, 700, 752, 438/753, 687, 723, 724, 725, 740, 683, 637, 438/770, 769; 257/E21.006, E21.054, E21.058, 257/E21.077, E21.32, E21.267, E21.278, 257/E21.293, E21.304, E21.311, E21.319, 257/E21.646
See application file for complete search history.

(56) References Cited

U.S. PATENT DOCUMENTS

| | | | | |
|---|---|---|---|---|
| 5,627,089 A | * | 5/1997 | Kim et al. | 438/158 |
| 5,930,657 A | * | 7/1999 | Kim et al. | 438/482 |
| 5,932,484 A | * | 8/1999 | Iwanaga et al. | 438/689 |
| 6,383,907 B1 | * | 5/2002 | Hasegawa et al. | 438/597 |
| 6,495,461 B2 | * | 12/2002 | Tsubouchi et al. | 438/683 |
| 6,509,277 B1 | * | 1/2003 | Saito et al. | 438/723 |
| 7,528,446 B2 | * | 5/2009 | Takafuji et al. | 257/347 |

FOREIGN PATENT DOCUMENTS

| | | |
|---|---|---|
| JP | 2001-028371 | 1/2001 |
| KR | 1020000076868 A | 12/2000 |
| KR | 1020020045494 A | 6/2002 |
| KR | 1020070002407 A | 1/2007 |

OTHER PUBLICATIONS

KR Office Action & English Translation of Corresponding KR App. No. 10-2007-006611, Mailed Jul. 11, 2008 (6 pgs.).

* cited by examiner

*Primary Examiner* — David Nhu
(74) *Attorney, Agent, or Firm* — Myers Bigel Sibley & Sajovec, P.A.

(57) ABSTRACT

A gate structure is formed on a substrate. An insulating interlayer is formed covering the gate structure. The substrate is heat treated while exposing a surface of the insulating interlayer to a hydrogen gas atmosphere. A silicon nitride layer is formed directly on the interlayer insulating layer after the heat treatment and a metal wiring is formed on the insulating interlayer. The metal wiring may include copper. Heat treating the substrate while exposing a surface of the interlayer insulating layer to a hydrogen gas atmosphere may be preceded by forming a plug through the first insulating interlayer that contacts the substrate, and the metal wiring may be electrically connected to the plug. The plug may include tungsten.

20 Claims, 16 Drawing Sheets

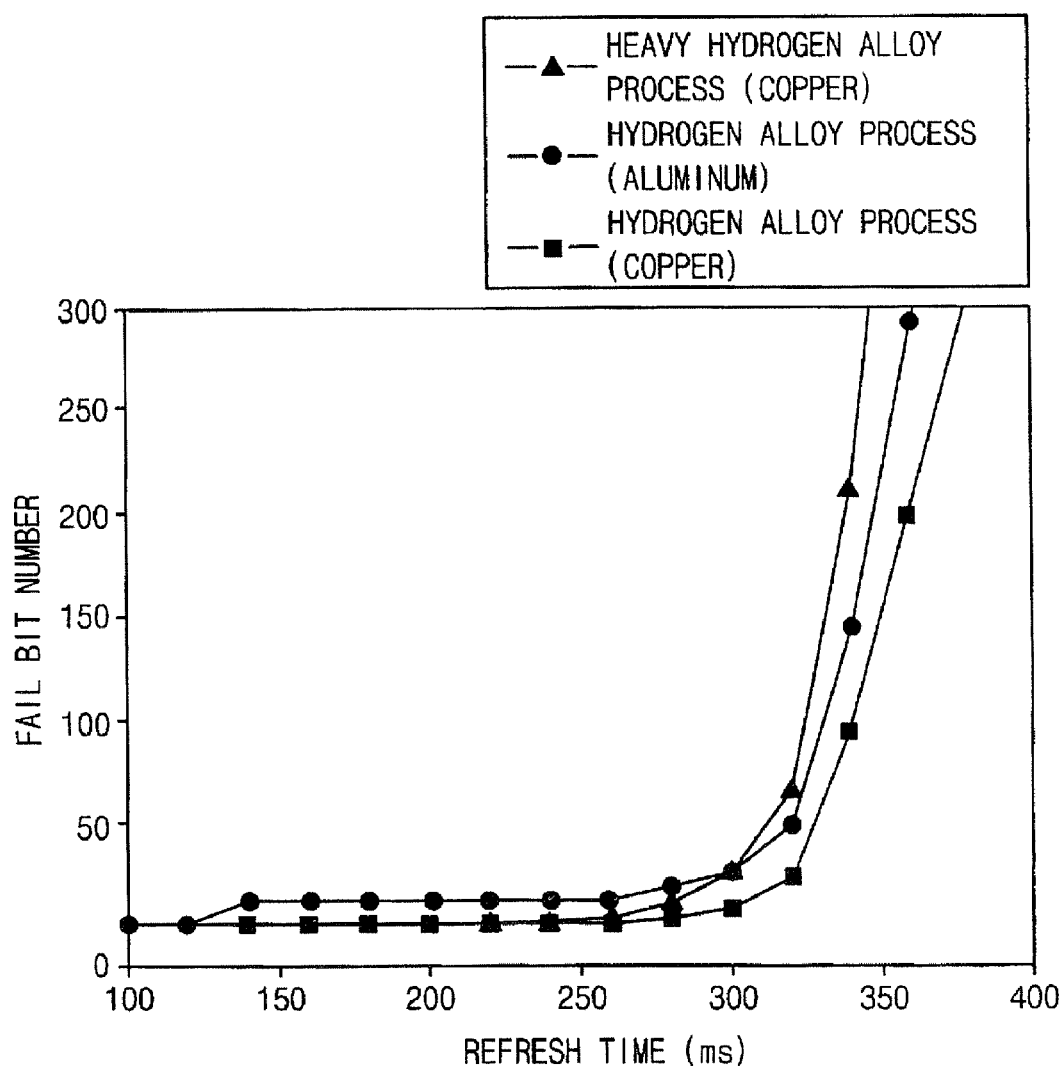

METHOD OF MANUFACTURING A SEMICONDUCTOR DEVICE

PRIORITY STATEMENT

This application claims priority under 35 USC §119 to Korean Patent Application No. 2007-0066111, filed on Jul. 2, 2007 in the Korean Intellectual Property Office (KIPO), the contents of which are herein incorporated by reference in their entirety.

FIELD OF THE INVENTION

The present invention relates to methods of manufacturing semiconductor devices and, more particularly, to methods of manufacturing semiconductor devices having gate structures.

BACKGROUND OF THE INVENTION

Silicon oxide layers are commonly used as insulation layers in gate structures of semiconductor devices. In a dynamic random access memory (DRAM) device, for example, silicon oxide may be used for a gate insulation layer, and in a flash memory device, silicon oxide may be used for a tunnel insulation layer.

A thermal oxidation process may be performed on a substrate including silicon to form a gate insulation layer including silicon oxide. When the gate insulation layer is formed, some of the outermost electrons of silicon atoms included in the gate insulation layer may not combine with each other, and thus dangling bonds may occur. The dangling bonds may trap other electrons so that the electrical characteristics, such as transistor threshold voltage and swing characteristics, may be degenerated.

In order to improve the electrical characteristics of the transistor by curing the dangling bonds, an alloy process may be performed. Particularly, after forming a transistor including a gate structure on a substrate, a metal wiring may be formed. A heat treatment process may be performed on the substrate having the transistor and the metal wiring at a temperature of about 400° C. for about 3 hours in an atmosphere of hydrogen gas. In this manner, dangling bonds formed on the gate insulation layer may be transformed into Si—H bonds.

As the degree of integration and operation speed of semiconductor devices have increased, the lengths of wiring formed in the semiconductor devices have generally increased. Due to the increased lengths of the wiring, the total resistance thereof has generally increased and, thus, the resistance-capacitance (RC) delay may be also increased. In order to reduce such problems, copper may be used for the wiring instead of aluminum.

However, when copper is used for wiring, an alloy process used to form the wiring may not cure dangling bonds. In particular, because the copper wiring may be formed by a damascene process, a silicon nitride layer serving as an etch stop layer in the damascene process may absorb hydrogen atoms so that movement of hydrogen atoms to the gate structure may be reduced.

FIG. 1 is a graph illustrating the amount of hydrogen atoms reaching a gate insulation layer for cases in which a silicon nitride layer is formed or not formed. Particularly, FIG. 1 shows the amount of hydrogen atoms included in the gate insulation layer after performing a heat treatment process on a gate structure in an atmosphere of hydrogen gas, when a silicon nitride layer is not formed on the gate structure (A) and when a silicon nitride layer is formed on the gate structure (B). Referring to FIG. 1, the amount of hydrogen atoms included in the gate insulation layer when a silicon nitride layer is formed (B) is much less than that when a silicon nitride layer is not formed (A).

Additionally, when an alloy process is performed after forming the copper wiring, copper ions of the copper wiring may move to neighboring insulation regions so that the reliability of the copper wiring may be degenerated. Furthermore, during an alloy process, gases may leak from a low-k dielectric layer serving as the insulation layer between the copper wiring, so that the semiconductor device may be degenerated.

SUMMARY OF THE INVENTION

Some embodiments of the present invention provide methods of manufacturing semiconductor devices. A gate structure is formed on a substrate. An insulating interlayer is formed covering the gate structure. The substrate is heat treated while exposing a surface of the insulating interlayer to a hydrogen gas atmosphere. A silicon nitride layer is formed directly on the interlayer insulating layer after the heat treatment and a metal wiring is formed on the insulating interlayer. The metal wiring may include copper. Heat treating the substrate while exposing a surface of the interlayer insulating layer to a hydrogen gas atmosphere may be preceded by forming a plug through the insulating interlayer that contacts the substrate. The metal wiring may be electrically connected to the plug, which may include tungsten.

Forming a plug through the insulating interlayer that contacts the substrate may include forming an opening through the insulating interlayer that exposes the substrate, forming a conductive layer on the insulating interlayer and in the opening and planarizing the conductive layer to expose the insulating interlayer. The planarizing of the conductive layer may include a chemical mechanical polishing (CMP) process and/or an etch-back process. Forming an insulating interlayer covering the gate structure may include forming a first insulating interlayer, and forming a metal wiring may include forming a second insulating interlayer directly on the silicon nitride layer, forming a hole through the second insulating interlayer and the silicon nitride layer to expose the plug and forming a metal layer in the hole through the second insulating interlayer and the silicon nitride layer.

Forming a silicon nitride layer directly on the insulating interlayer after the heat treatment may include forming a first silicon nitride layer directly on the first insulating interlayer after the heat treatment, forming a second insulating interlayer directly on the silicon nitride layer may include forming the second insulating interlayer directly on the first silicon nitride layer, and forming a metal layer in the hole through the second insulating interlayer and the silicon nitride layer may include forming a first metal layer in the hole through the second insulating interlayer and the first silicon nitride layer. Forming a metal wiring may further include forming a second silicon nitride layer directly on the second insulating interlayer, forming a third insulating interlayer directly on the second silicon nitride layer, forming a third silicon nitride layer directly on the third insulating interlayer, forming a fourth insulating interlayer directly on the third silicon nitride layer, forming a hole through the fourth insulating interlayer, the third silicon nitride layer and the third insulating interlayer exposing a portion of the second silicon nitride layer, removing a portion of the fourth insulating interlayer to expose a portion of the third silicon nitride layer adjacent the hole, removing the exposed portions of the third silicon nitride layer adjacent the hole and the exposed portion of the second silicon nitride layer in the hole to expose a portion of the metal layer at a bottom of the hole and forming a second metal layer on the exposed first metal layer.

According to further embodiments, heat treating the substrate while exposing a surface of the insulating interlayer to a hydrogen gas atmosphere may include heat treating the substrate while exposing a surface of the insulating interlayer to a hydrogen gas atmosphere at a temperature of about 200 to about 600° C. for about 1 to 5 hours. In some embodiments, heat treating the substrate while exposing a surface of the insulating interlayer to a hydrogen gas atmosphere may include heat treating the substrate while exposing a surface of the insulating interlayer to a mixed atmosphere including hydrogen gas and an inactive gas.

In additional embodiments, a protection layer may be formed on the metal wiring and the substrate may be heat treated while exposing a surface of the protection layer to a hydrogen gas atmosphere. The operations of heat treating the substrate while exposing a surface of the insulating interlayer to a hydrogen gas atmosphere and heat treating the substrate while exposing a surface of the protection layer to a hydrogen gas atmosphere may be performed for substantially the same amount of time.

The substrate may include silicon, and the gate structure may have a gate insulation layer including silicon oxide. Dangling bonds of the gate insulation layer may be cured by the heat treating the substrate while exposing a surface of the insulating interlayer to a hydrogen gas atmosphere. In some embodiments, the gate structure may include a tunnel insulation layer, a floating gate, a dielectric layer and a control gate stacked on the substrate. The substrate may include silicon and the tunnel insulation layer may include silicon oxide. Dangling bonds of the tunnel insulation layer may be cured by the heat treating the substrate while exposing a surface of the insulating interlayer to a hydrogen gas atmosphere.

Some embodiments of the present invention provide methods of manufacturing semiconductor devices which may have improved electrical characteristics by effectively curing dangling bonds in a gate insulation layer.

According to some embodiments of the present invention, there is provided a method of manufacturing a semiconductor device. In the method, a gate structure is formed on a substrate. A first heat treatment process is performed on the substrate having the gate structure in an atmosphere of hydrogen gas. A metal wiring is formed on the substrate.

In some embodiments of the present invention, the metal wiring may include copper.

In some embodiments of the present invention, prior to performing the first heat treatment process, a first insulating interlayer may be formed on the substrate to cover the gate structure. A plug may be formed through the first insulating interlayer. The metal wiring may be electrically connected to the plug.

In some embodiments of the present invention, when the plug is formed, an opening may be formed through the first insulating interlayer. A conductive layer may be formed on the first insulating interlayer to fill up the opening. An upper portion of the conductive layer may be planarized until the first insulating interlayer is exposed. The upper portion of the conductive layer may be planarized by a chemical mechanical polishing (CMP) process, an etch-back process, or a combination process thereof.

In some embodiments of the present invention, when the metal wiring is formed, a first etch stop layer and a second insulating interlayer may be formed on the first insulating interlayer. A first hole exposing the plug may be formed through the first etch stop layer and the second insulating interlayer. A first metal layer filling up the first hole may be formed. The first etch stop layer may include silicon nitride. The second insulating interlayer may include a low-k material.

In some embodiments of the present invention, when the metal wiring is formed, a second etch stop layer, a third insulating interlayer, a third etch stop layer and a fourth insulating interlayer may be formed on the first insulating interlayer. A second hole partially exposing the second etch stop layer may be formed through the fourth insulating interlayer, the third etch stop layer and the third insulating interlayer, the second hole. A trench in fluid communication with the second hole may be formed through the fourth insulating interlayer. A portion of the second etch stop layer exposed by the second hole and a portion of the third etch stop layer exposed by the trench may be removed. A second metal layer filling up the second hole and the trench may be formed. The second and third etch stop layers may include silicon nitride. The third and fourth insulating interlayers may include a low-k material.

In some embodiments of the present invention, the first heat treatment process may be performed at a temperature of about 200 to about 600° C. for about 1 to 5 hours.

In some embodiments of the present invention, the first heat treatment process may be performed in an atmosphere of mixed gas including hydrogen gas and an inactive gas.

In some embodiments of the present invention, a protection layer may be further formed on the substrate having the metal wiring. A second heat treatment process may be further performed on the substrate in an atmosphere of hydrogen gas. The second heat treatment process may be performed during a time period substantially the same as or less than that of the first heat treatment process.

In some embodiments of the present invention, the substrate may include silicon, and the gate structure may have a gate insulation layer including silicon oxide. Dangling bonds of the gate insulation layer may be cured by the first heat treatment process.

In some embodiments of the present invention, the metal wiring may include a bit line.

In some embodiments of the present invention, the gate structure may include a tunnel insulation layer, a floating gate, a dielectric layer and a control gate sequentially stacked on the substrate. The substrate may include silicon, and the tunnel insulation layer may include silicon oxide. Dangling bonds of the tunnel insulation layer may be cured by the first heat treatment process.

According to some example embodiments of the present invention, before forming a silicon nitride layer serving as an etch stop layer in a damascene process for forming a copper wiring, a heat treatment process is performed in an atmosphere of hydrogen gas, so that hydrogen atoms may be prevented from being absorbed into the silicon nitride layer. Thus, the hydrogen atoms may effectively move to a gate insulation layer, and the dangling bonds of the gate insulation layer may be effectively cured. Additionally, because the heat treatment process is performed before forming the copper wiring, copper ions may be prevented from leaking from the copper wiring. Furthermore, even though a low-k material such as FSG or TEOS oxide layer is used for forming insulating interlayers between metal wiring, the heat treatment process is performed before forming the insulating interlayers, so that gases do not leak from the insulating interlayers during the heat treatment process and thus the semiconductor device may not be degenerated.

BRIEF DESCRIPTION OF THE DRAWINGS

The above and other features and advantages of the present invention will become more apparent by describing in detailed example embodiments thereof with reference to the accompanying drawings.

FIGS. 3A and 3B are graphs illustrating a static refresh time and a dynamic refresh time of a semiconductor device;

DETAILED DESCRIPTION OF THE INVENTION

Figure 1:
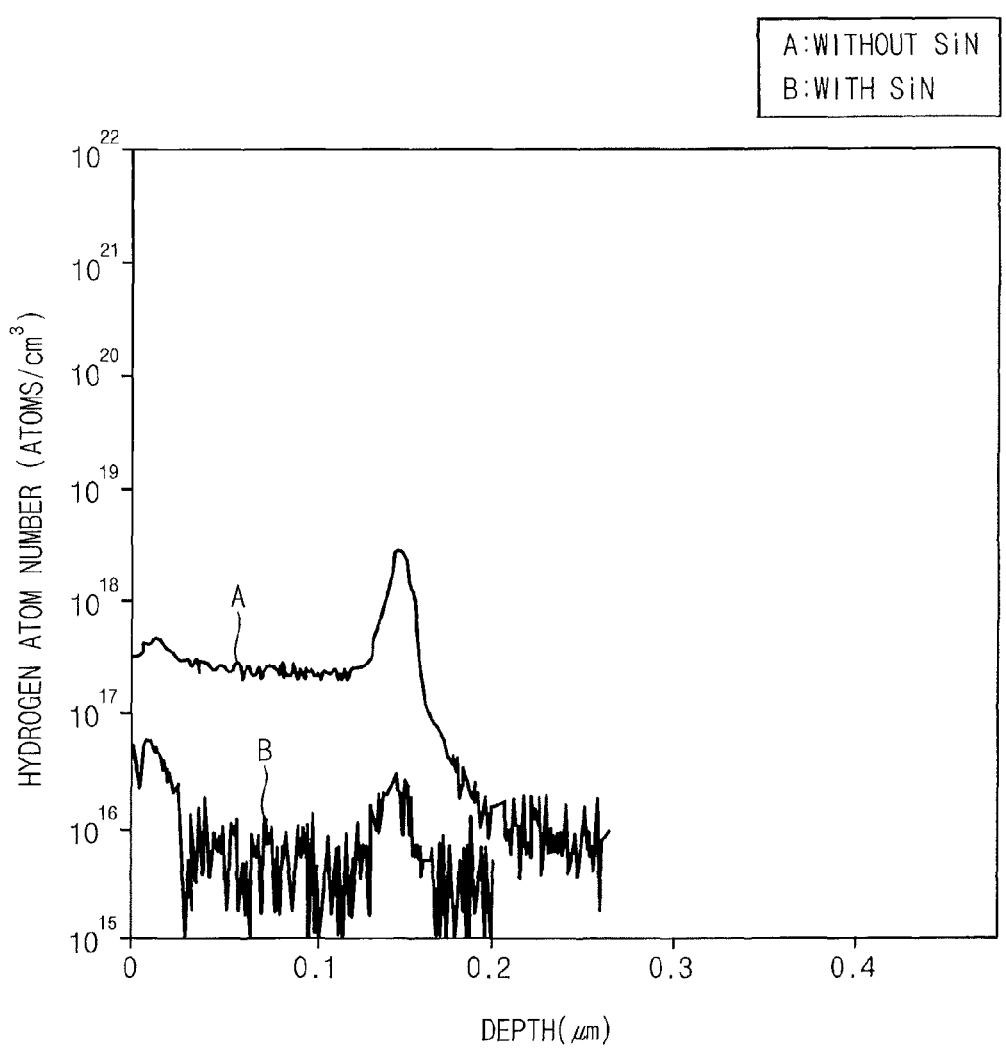
FIG. 1 is a graph illustrating the amount of hydrogen atoms reaching a gate insulation layer depending on whether or not a silicon nitride layer is formed.

Some embodiments of the present invention are described more fully hereinafter with reference to the accompanying drawings. The present invention may, however, be embodied in many different forms and should not be construed as limited to the example embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising" and/or "includes" and/or "including", when used in this specification, specify the presence of stated features, integers, steps, operations, elements, and/or components, but do not preclude the presence or addition of one or more other features, integers, steps, operations, elements, components, and/or groups thereof.

Some embodiments of the invention are described herein with reference to cross-sectional illustrations that are schematic illustrations of idealized example embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, some embodiments of the present invention will be explained in detail with reference to the accompanying drawings.

Figure 2A:
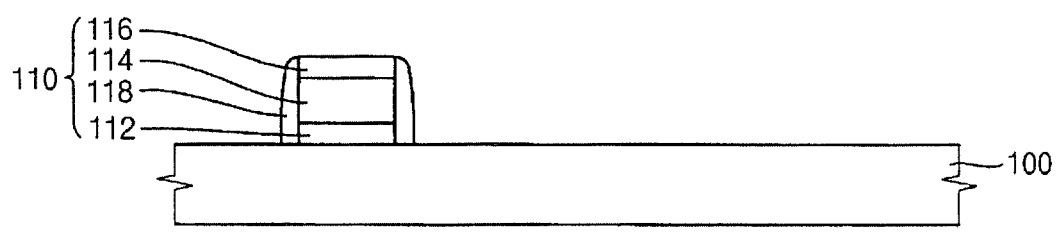
FIGS. 2A-2N are cross-sectional views illustrating operations for manufacturing a semiconductor device in accordance with some embodiments of the present invention.
Figure 2B:
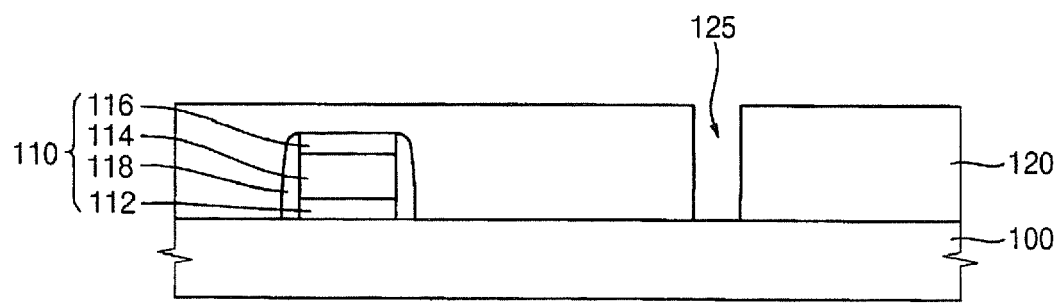
Figure 2C:
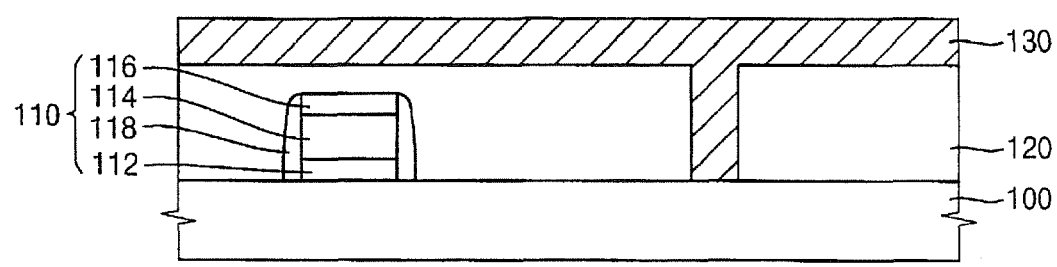
Figure 2D:
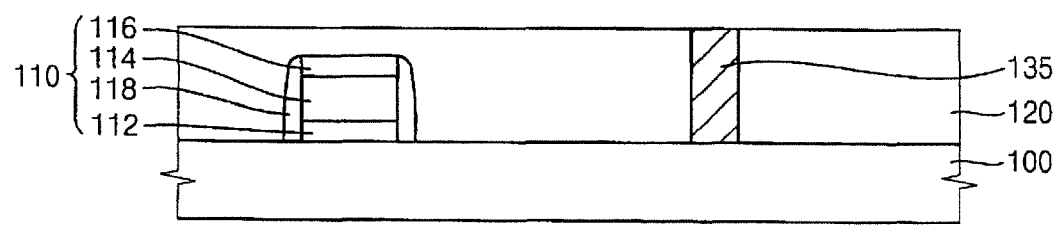
Figure 2E:
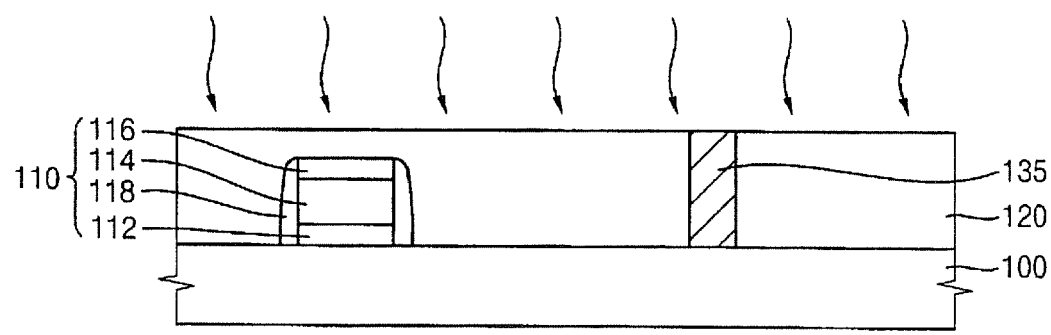
Figure 2F:
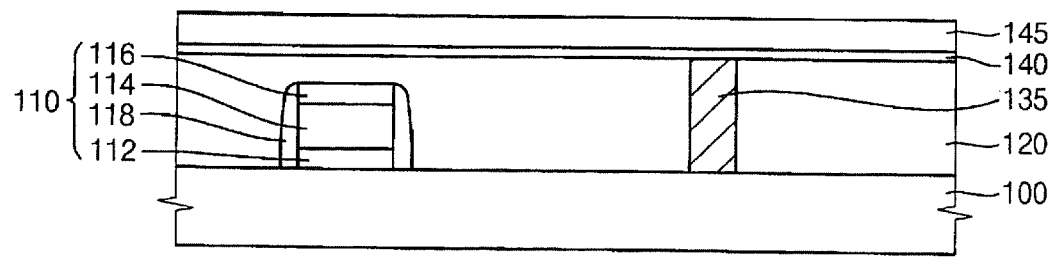
Figure 2G:
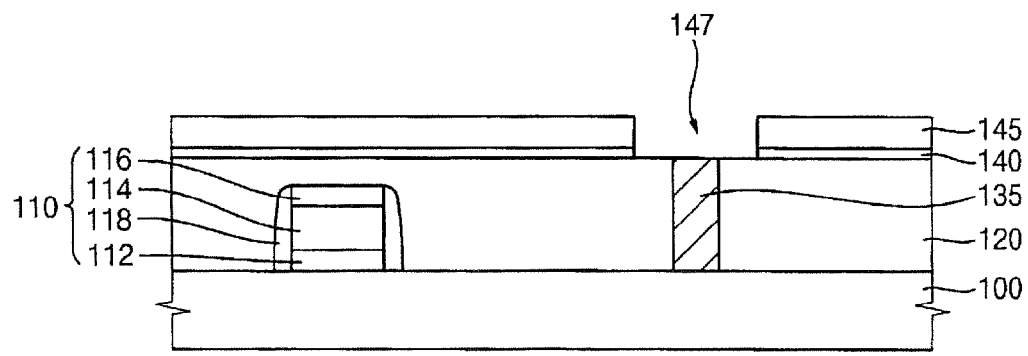
Figure 2H:
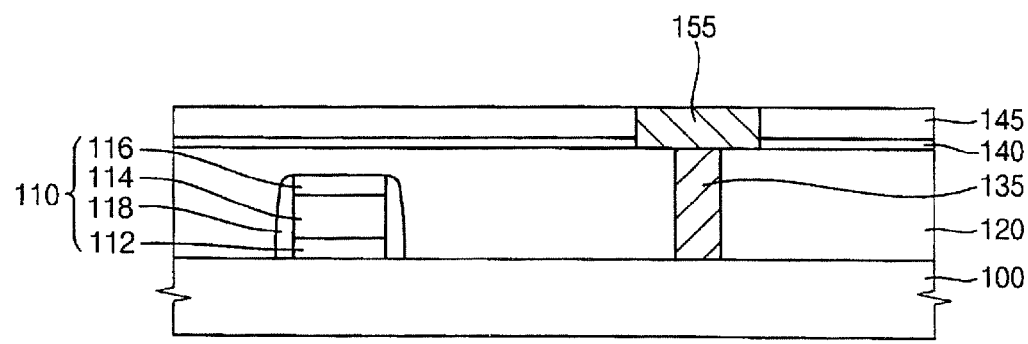
Figure 2I:
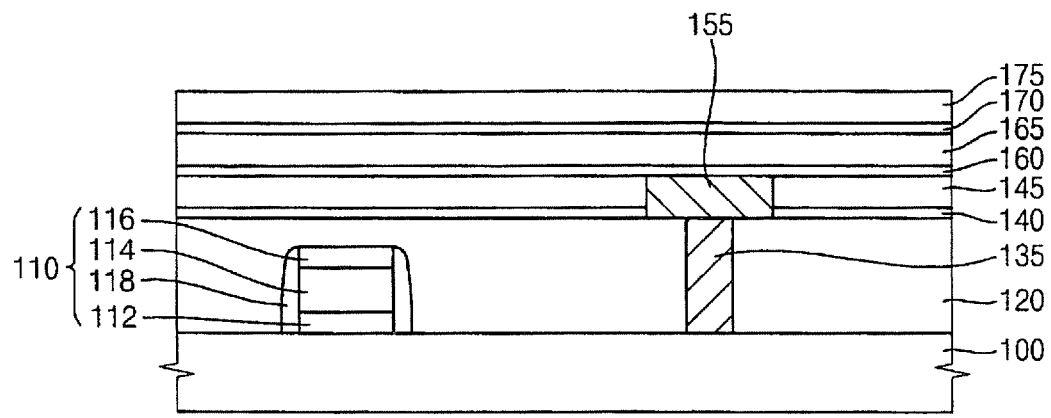
Figure 2J:
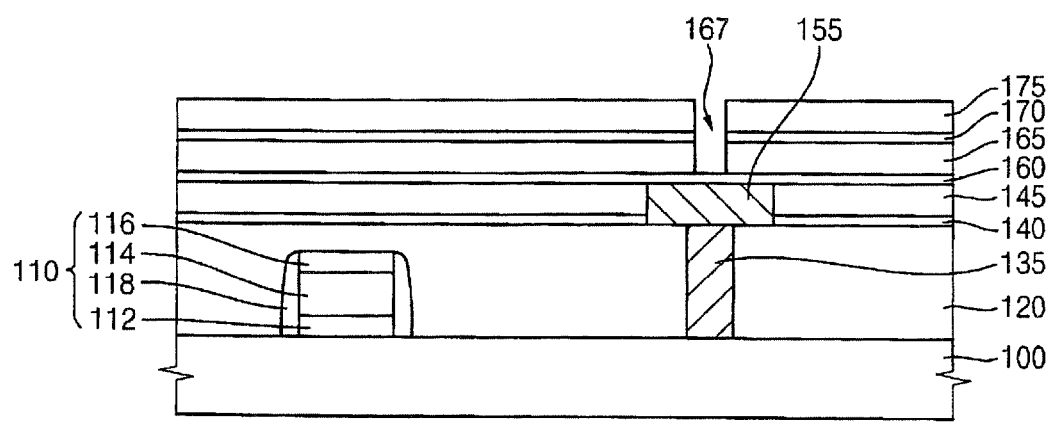
Figure 2K:
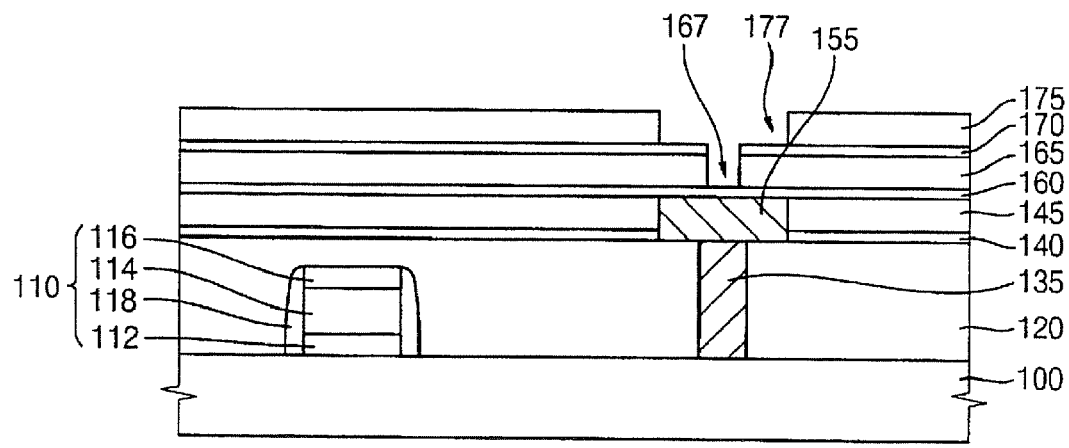
Figure 2L:
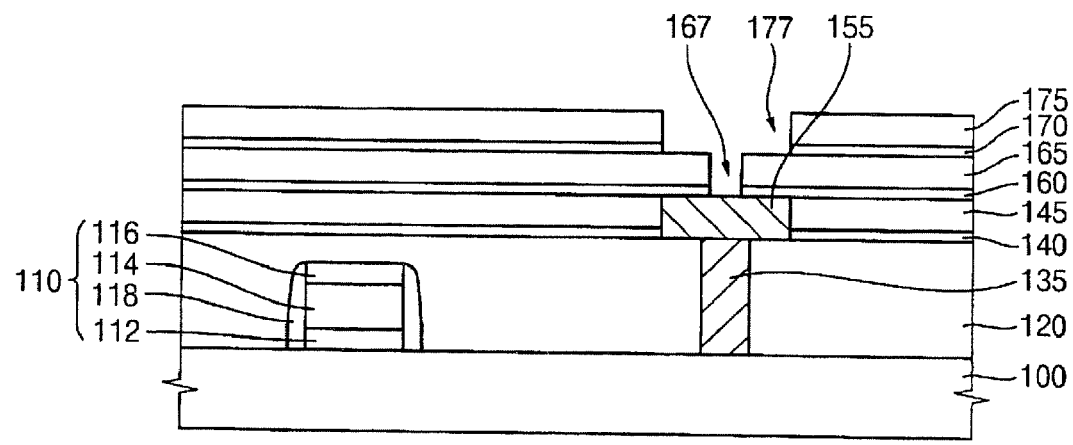
Figure 2M:
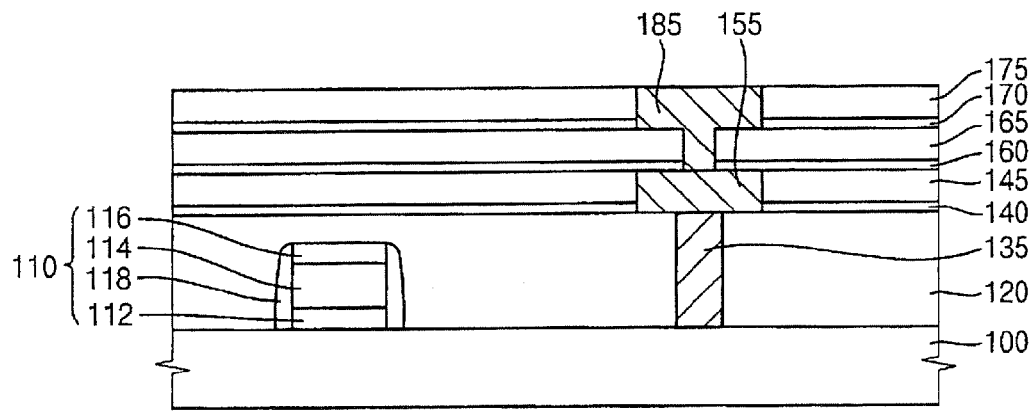
Figure 2N:
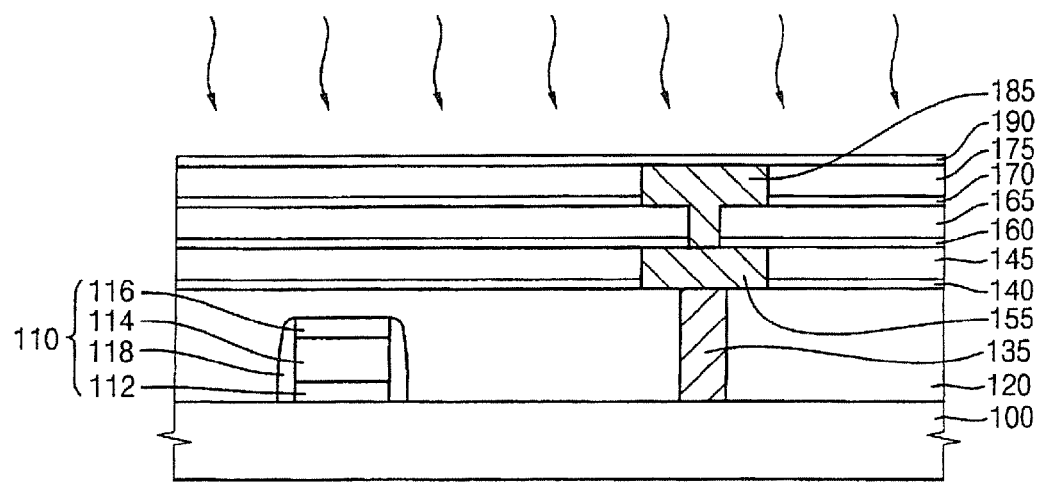

FIGS. 2A to 2N are cross-sectional views illustrating operations for manufacturing a semiconductor device in accordance with some embodiments of the present invention.

Referring to FIG. 2A, a gate structure 110 is formed on a substrate 100. The substrate 100 may include a semiconductor substrate, such as a silicon substrate, a germanium substrate, a silicon-germanium substrate, a silicon-on-insulator (SOI) substrate, a germanium-on-insulator (GOI) substrate, etc. In some embodiments of the present invention, the substrate 100 may be a silicon substrate. An isolation layer (not shown) may be formed at an upper portion of the substrate 100 by, for example, a shallow trench isolation (STI) process or a thermal oxidation process, thereby defining an active region and a field region in the substrate 100.

A gate insulation layer, a gate conductive layer and a gate mask layer are sequentially formed on the substrate 100, and the gate mask layer, the gate conductive layer and the gate insulation layer are patterned to form the gate structure 110 on the active region of the substrate 100.

The gate insulation layer may be formed, for example, by a thermal oxidation process on the substrate 100. In some embodiments of the present invention, a top surface of the substrate 100 including silicon is thermally oxidized to form the gate insulation layer. During the thermal oxidation process, dangling bonds may be formed in the gate insulation layer. The gate conductive layer may be formed using, for example, doped polysilicon, a metal and/or a metal silicide. The gate mask layer may be formed using, for example, silicon nitride or silicon oxynitride.

The gate structure 110 has a gate insulation layer pattern 112, a gate electrode 114 and a gate mask 116 sequentially stacked on the substrate 100. The gate structure 110 may further have a gate spacer 118 including a nitride such as silicon nitride. The gate spacer 118 may be formed by forming a nitride layer on the substrate 100 to cover the gate insulation layer pattern 112, the gate electrode 114 and the gate mask 116, and performing an anisotropic etching process on the nitride layer.

An ion implantation process using the gate structure 110 as an ion implantation mask may be performed on the substrate 100 to form impurity regions at upper portions of the active region adjacent to the gate structure 110. Thus, a transistor including the gate structure 110 and the impurity regions may be formed on the active region of the substrate 100.

Referring to FIG. 2B, a first insulating interlayer 120 is formed on the substrate 100 to cover the gate structure 110. The first insulating interlayer 120 is formed using, for example, an oxide, a nitride and/or an oxynitride. The first insulating interlayer 120 may be formed by, for example, a chemical vapor deposition (CVD) process, an atomic layer deposition (ALD) process, etc.

After forming a photoresist pattern (not shown) on the first insulating interlayer 120, the first insulating interlayer 120 is partially removed by an etching process using the photoresist pattern as an etching mask, thereby forming an opening 125 through the first insulating interlayer 120. The opening 125 exposes the impurity regions. After forming the opening 125, the photoresist pattern may be removed by an ashing process and/or a stripping process.

Referring to FIG. 2C, a conductive layer 130 is formed on the first insulating interlayer 120 to fill up the opening 125. The conductive layer 130 may be formed using, for example, a metal and/or a metal nitride. In some embodiments of the present invention, the conductive layer 130 is formed using, for example, tungsten.

Before forming the conductive layer 130, a barrier layer (not shown) may be further formed on a bottom and a sidewall of the opening 125 and the first insulating interlayer 120. The barrier layer may have a multi-layered structure in which a metal layer and a metal nitride layer are stacked. In some embodiments of the present invention, the barrier has a multi-layered structure including a titanium layer and a titanium nitride layer. The barrier layer may prevent the conductive layer 130 from diffusing to the first insulating interlayer 120.

Referring to FIG. 2D, the conductive layer 130 is partially removed until the first insulating interlayer 120 is exposed, so that a plug 135 filling up the opening 125 may be formed. The plug 135 is located on the impurity region. In some embodiments of the present invention, the plug 135 is formed by, for example, a chemical mechanical polishing (CMP) process and/or an etch-back process.

Referring to FIG. 2E, a first heat treatment process is performed on the substrate 100 having the gate structure 110, the first insulating interlayer 120 and the plug 135 in an atmosphere of hydrogen gas. The first heat treatment process may be performed in an atmosphere of mixed gas including hydrogen gas and an inactive gas, such as nitrogen gas. Alternatively, the first heat treatment process may be performed in an atmosphere of heavy hydrogen gas. However, as illustrated later with reference to FIGS. 3A and 3B, when the first heat treatment process is performed in an atmosphere of hydrogen gas, curing dangling bonds of the gate insulation layer pattern 112 may have higher effects than that when the first heat treatment process is performed in an atmosphere of heavy hydrogen gas. The first heat treatment process may be performed at a temperature of about 200 to about 600° C. for about 1 to 5 hours.

Due to the first heat treatment process, the dangling bonds of the gate insulation layer pattern 112 may be cured. Particularly, silicon atoms of which covalent bonds with other silicon atoms have been broken during the thermal oxidation process may be combined with hydrogen atoms to form Si—H bonds during the first heat treatment process, and thus the dangling bonds of the gate insulation layer pattern 112 may be cured.

Particularly, when the first heat treatment process is performed, no silicon nitride layer has been formed to reduce movement of hydrogen atoms to the gate insulation layer pattern 112, and thus the dangling bonds may be sufficiently cured.

Referring to FIG. 2F, a first etch stop layer 140 and the second insulating interlayer 145 are formed on the first insulating interlayer 120 and the plug 135. The first etch stop layer 140 may be formed using silicon nitride, silicon carbide, silicon oxynitride, silicon oxycarbide, etc. In some embodiments of the present invention, the first etch stop layer 140 is formed using silicon nitride. The second insulating interlayer 145 may be formed using, for example, an oxide, a nitride and/or an oxynitride. In some embodiments of the present invention, the second insulating interlayer 145 is formed using, for example, fluoro-silicate glass (FSG) or tetraethyl orthosilicate (TEOS) oxide, which has a low dielectric constant. The first etch stop layer 140 and the second insulating interlayer 145 may be formed by, for example, a CVD process or an ALD process.

Referring to FIG. 2G after forming a photoresist pattern (not shown) on the second insulating interlayer 145, the second insulating interlayer 145 is partially removed by an etching process using the photoresist pattern as an etching mask until the first etch stop layer 140 is exposed. The exposed portion of the first etch stop layer 140 is removed to form a first hole 147 exposing the plug 135. Some portions of the first insulating interlayer 120 adjacent to the plug 135 may be also exposed by the first hole 147. After forming the first hole 147, the photoresist pattern may be removed by an ashing process and/or a stripping process.

Referring to FIG. 2H, a first metal layer is formed on the second insulating interlayer 145 to fill up the first hole 147. The first metal layer may be formed using, for example, copper, aluminum, tungsten, etc. In some embodiments of the present invention, the first metal layer is formed using copper.

The first metal layer is partially removed until the second insulating interlayer 145 is exposed, thereby forming a first metal wiring 155 filling up the first hole 147. The first metal wiring 155 is electrically connected to the plug 135. In some embodiments of the present invention, the first metal wiring 155 serves as a bit line in a flash memory device or a DRAM device. The first metal wiring 155 may be formed by, for example, a CMP process and/or an etch-back process. As illustrated with reference to FIGS. 2F to 2H, the first metal wiring 155 may be formed by, for example, a single damascene process.

Referring to FIG. 2I, a second etch stop layer 160, a third insulating interlayer 165, a third etch stop layer 170 and a fourth insulating interlayer 175 are formed on the second insulating interlayer 145 and the first metal wiring 155. The second and third etch stop layers 160 and 170 may be formed using, for example, silicon nitride, silicon carbide, silicon oxynitride, silicon oxycarbide, etc. In some embodiments of the present invention, the second and third etch stop layers 160 and 170 are formed using silicon nitride. The third and fourth insulating interlayers 165 and 175 may be formed using, for example, an oxide, a nitride and/or an oxynitride. In some embodiments of the present invention, the third and fourth insulating interlayers 165 and 175 are formed using, for example, FSG or TEOS oxide having a low dielectric constant. The second and third etch stop layers 160 and 170 and the third and fourth insulating interlayers 165 and 175 may be formed by, for example, a CVD process or an ALD process.

Referring to FIG. 2J, after forming a photoresist pattern (not shown) on the fourth insulating interlayer 175, the fourth insulating interlayer 175, the third etch stop layer 170 and the third insulating interlayer 165 are partially removed by an etching process using the photoresist pattern as an etching mask, thereby forming a second hole 167.

Referring to FIG. 2K, after forming a photoresist pattern (not shown) on the fourth insulating interlayer 175, the fourth insulating interlayer 175 is partially removed by an etching process using the photoresist pattern as an etching mask, thereby forming a trench 177.

Referring to FIG. 2L, exposed portions of the third etch stop layer 170 and the second etch stop layer 160 are removed. Thus, the depths of the second hole 167 and the trench 177 may be greater.

Referring to FIG. 2M, a second metal layer is formed on the fourth insulating interlayer 175 to fill up the second hole 167 and the trench 177. The second metal layer may be formed using, for example, copper, aluminum, tungsten, etc. In some embodiments of the present invention, the second metal layer is formed using copper.

The second metal layer is partially removed until the fourth insulating interlayer 175 is exposed, thereby forming a second metal wiring 185 filling up the second hole 167 and the trench 177. The second metal wiring 185 is electrically connected to the first metal wiring 155. The second metal wiring 185 may be formed by, for example, a CMP process and/or an etch-back process. As illustrated with reference to FIGS. 2I to 2M, the second metal wiring 185 may be formed by a dual damascene process.

Alternatively, the first metal wiring 155 may be formed by a dual damascene process, and the second metal wiring 185 may be formed by a single damascene process. Furthermore, one or more than one metal wiring may be formed on the second metal wiring 185 by a single damascene process and/or a dual damascene process.

When the metal wiring 155 and 185 are formed using, for example, copper, an aluminum pad may be further formed on the second metal wiring 185.

Referring to FIG. 2N, a passivation layer 190 is formed on the fourth insulating interlayer 175 and the second metal wiring 185. The passivation layer 190 may protect the gate structure 110, the metal wiring 155 and 185, etc., which are formed on the substrate 100.

A second heat treatment process may be further performed on the substrate 100 having the gate structure 110, the metal wiring 155 and 185, etc., in an atmosphere of hydrogen gas. The second heat treatment process may be performed in an atmosphere of mixed gas including hydrogen gas and an inactive gas, such as nitrogen gas. As described above, when the second heat treatment process is performed for a long time, copper ions included in the metal wiring 155 and 185 may leak or gases may leak from the insulating interlayers 145, 165, 175 including a low-k material. Thus, the second heat treatment process may be performed only when the dangling bonds of the gate insulation layer 112 have not been sufficiently cured during the first heat treatment process.

By the above processes, the semiconductor device in accordance with some embodiments of the present invention may be manufactured. Even though the semiconductor device has the metal wiring including copper, the dangling bonds of the gate insulation layer pattern may be effectively cured. That is, before forming the silicon nitride layer serving as the etch stop layer in the damascene process, the first heat treatment process is performed in an atmosphere of hydrogen gas, so that hydrogen atoms may be prevented from being absorbed into the silicon nitride layer. Thus, the hydrogen atoms may effectively move to the gate insulation layer pattern, and the dangling bonds of the gate insulation layer pattern may be effectively cured. Additionally, because the first heat treatment process is performed before forming the copper wiring, copper ions may be prevented from leaking from the copper wiring. Furthermore, even though the low-k material such as FSG or TEOS oxide layer is used for forming the insulating interlayers in order to reduce the cross-talk between metal wiring, the first heat treatment process is performed before forming the insulating interlayers, so that gases do not leak from the insulating interlayers during the first heat treatment process and thus the semiconductor device may not be degenerated.

Figure 3B:
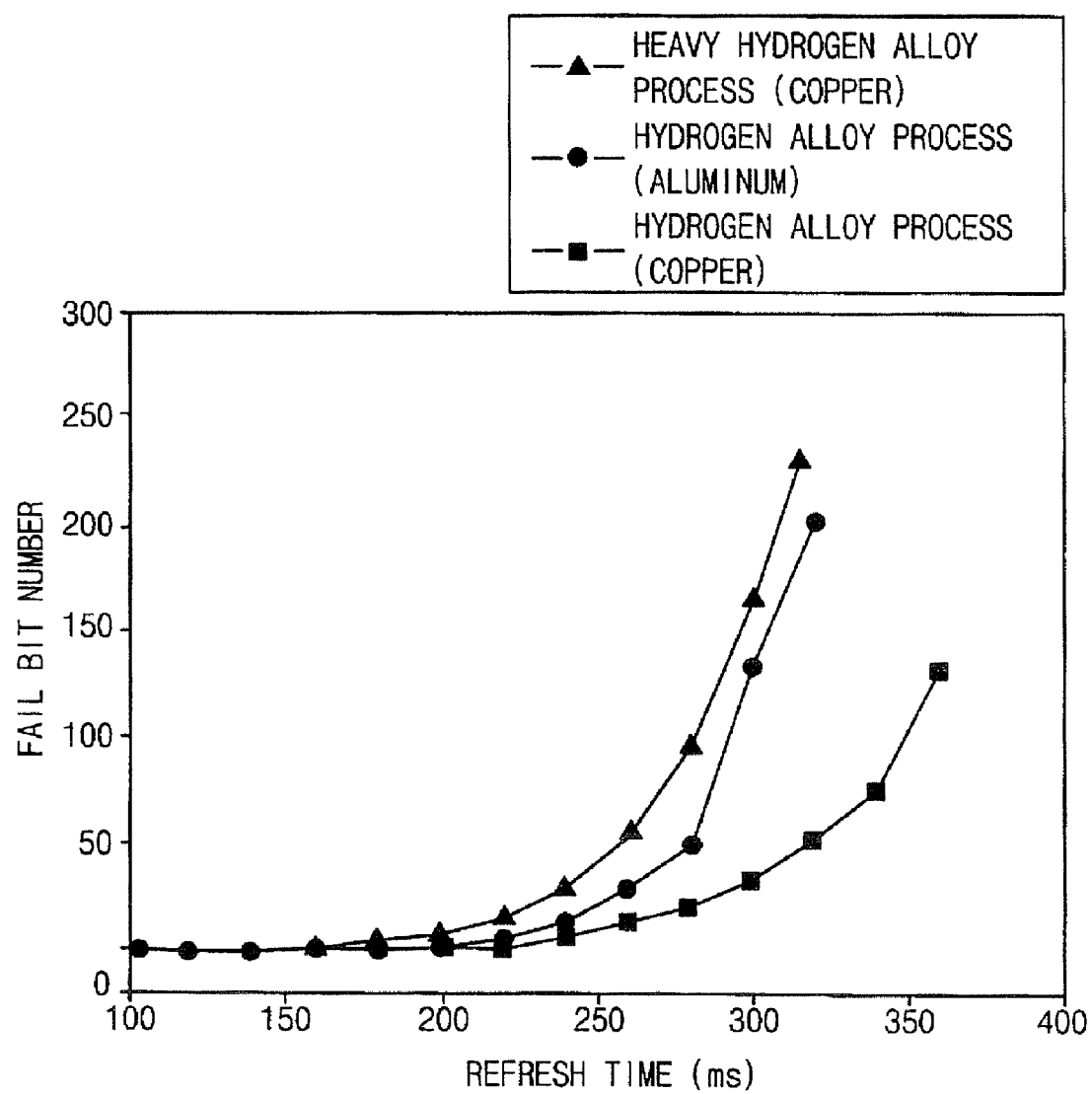

The effects of curing the dangling bonds of the gate insulation layer pattern 112 by the first heat treatment process may be illustrated with reference to FIGS. 3A and 3B. FIGS. 3A and 3B are graphs illustrating a static refresh time and a dynamic refresh time of a semiconductor device. Particularly, the curve denoted "▲" shows a static refresh time and a dynamic refresh time of a semiconductor device when a heat treatment process was performed on the semiconductor device having a copper wiring in an atmosphere of heavy hydrogen gas. The curve "■" shows a static refresh time and a dynamic refresh time of a semiconductor device when a heat treatment process was performed on the semiconductor device having an aluminum wiring in an atmosphere of hydrogen gas. The curve "●" shows a static refresh time and a dynamic refresh time of a semiconductor device when a heat treatment process was performed on the semiconductor device having a copper wiring in an atmosphere of hydrogen gas. In the cases of the semiconductor devices having the copper wiring, the heat treatment processes were performed before forming the copper wiring, and in the case of the semiconductor device having the aluminum wiring, the heat treatment process was performed after forming the aluminum wiring. FIG. 3A shows the static refresh time, and FIG. 3B shows the dynamic refresh time.

Referring to FIGS. 3A and 3B, for example, if the fail bit number is 100 in the semiconductor device having the same copper wiring, the refresh time of the semiconductor device manufactured by a heat treatment process in an atmosphere of hydrogen gas is longer than that manufactured by a heat treatment process in an atmosphere of heavy hydrogen gas. The fact that the refresh time is relatively longer for the same fail bit number means that the semiconductor device generally has a relatively higher reliability. Additionally, when the heat treatment process is performed at the same atmosphere of hydrogen gas, the semiconductor device having the copper wiring has a relatively longer refresh time than that having the aluminum wiring. That is, when a heat treatment process is performed before forming a metal wiring in an atmosphere of hydrogen gas, the curing of dangling bonds may be relatively greater.

Figure 4:
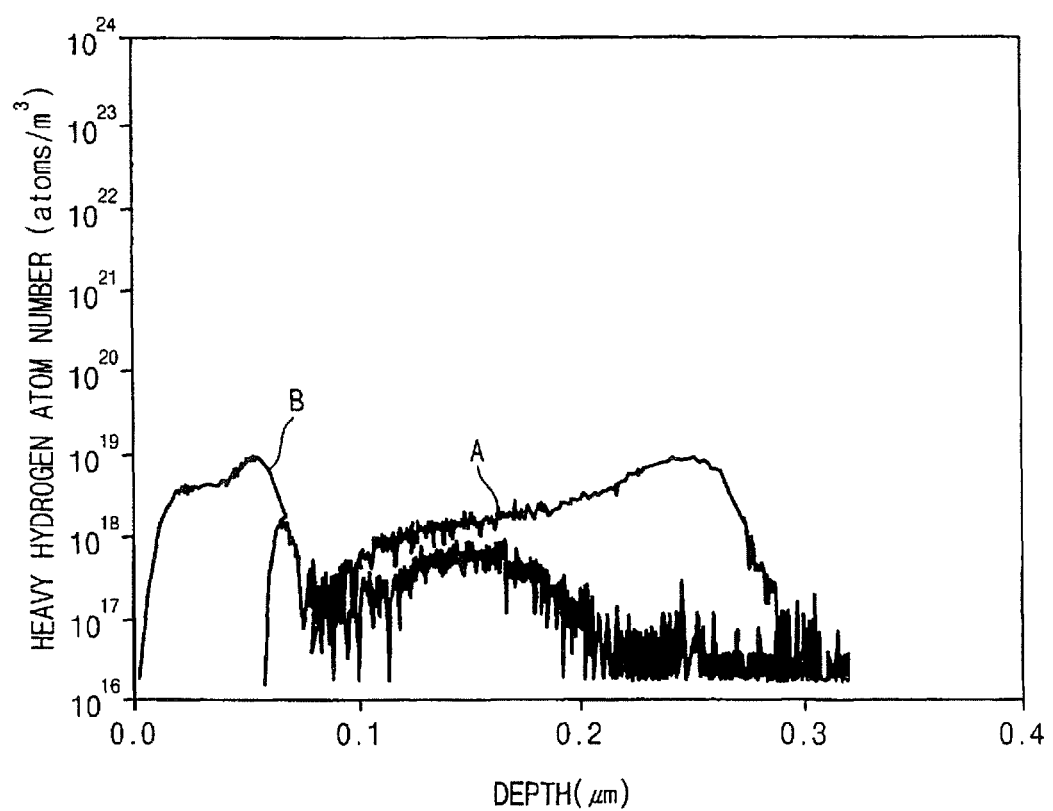
FIG. 4 is a graph illustrating the number of heavy hydrogen atoms distributed in a gate insulation layer when a successive high temperature treatment process is not performed and when a successive high temperature treatment process is performed.

The result that the reliability of the semiconductor device manufactured by a heat treatment in an atmosphere of heavy hydrogen gas may be lower than that manufactured by a heat treatment in an atmosphere of hydrogen gas may be explained with reference to FIG. 4. FIG. 4 is a graph illustrating the number of heavy hydrogen atoms distributed in a gate insulation layer when a successive high temperature treatment process is not performed (A) and when a successive high temperature treatment process is performed.

Referring to FIG. 4, the number of the heavy hydrogen atoms in the gate insulation layer has been remarkably reduced when the succeeding high temperature treatment process is performed (B) compared to that when the succeeding high temperature treatment process is not performed (A). That is, even though the heat treatment process is performed in an atmosphere of heavy hydrogen gas to form a lot of Si-D bonds in the gate insulation layer so that the dangling bonds of the gate insulation layer may be cured, in the successive high temperature treatment process, the heavy hydrogen atoms may move from the Si-D bonds and the curing effects may be reduced.

When a heat treatment process is performed in an atmosphere of hydrogen gas to cure the dangling bonds of the gate insulation layer, even though the successive high temperature treatment process is performed, the curing effects may not be reduced very much. However, even though the heat treatment process is performed in an atmosphere of hydrogen gas, the curing effects may be reduced a little due to the succeeding high temperature treatment process, and thus the heat treatment process is preferably performed after the high temperature treatment process. For example, because a high temperature treatment process is needed in forming the barrier layer by depositing titanium nitride when the plug 135 is formed, the heat treatment process is preferably formed after forming the plug 135.

FIGS. 5A to 5E are cross-sectional views illustrating operations for manufacturing a semiconductor device in accordance with other embodiments of the present invention. FIGS. 5A to 5E show operations for manufacturing a DRAM device, however, the scope of the present invention is not limited thereto.

Figure 5A:
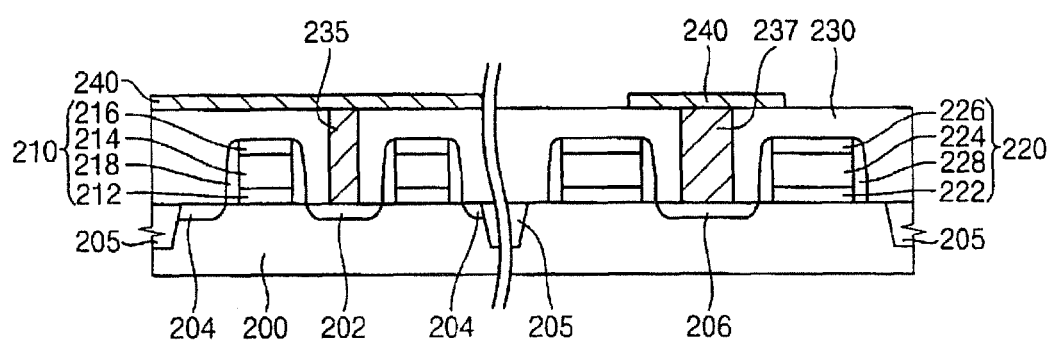
FIGS. 5A to 5E are cross-sectional views illustrating operations for manufacturing a semiconductor device in accordance with further embodiments of the present invention.

Referring to FIG. 5A, an isolation layer 205 is formed on the substrate 200 by, for example, a STI process or a thermal oxidation process, thereby defining an active region and a field region in the substrate 200. A first gate structure 210 and a second gate structure 220 are formed on the active region of the substrate 200. The first gate structure 210 is formed on a cell region, and the second gate structure 220 is formed on a core/peri region. The first gate structure 210 has a first gate insulation layer pattern 212, a first gate electrode 214, a first gate mask 216 and a first gate spacer 218. The second gate structure 220 has a second gate insulation layer pattern 222, a second gate electrode 224, a second gate mask 226 and a second gate spacer 228.

The first and second gate insulation layer patterns 212 and 222 may be formed on a top surface of the substrate 200 by a thermal oxidation process, and thus may include silicon oxide. In this process, dangling bonds may be formed in the first and second gate insulation layer patterns 212 and 222. The first and second gate electrodes 214 and 224 may be formed using, for example, doped polysilicon, a metal and/or a metal silicide. The first and second gate masks 216 and 226 may be formed using, for example, silicon nitride or silicon oxynitride. The first and second gate spacers 218 and 228 may be formed, for example, using a nitride, such as silicon nitride.

An ion implantation process using the first and second gate structures 210 and 220 as an ion implantation mask may be performed on the substrate 200 to form a first impurity region 202 and a second impurity region 204 at upper portions of the active region adjacent to the first gate structure 210, and a third impurity region 206 at an upper portion of the active region adjacent to the second gate structure 220. Thus, a first transistor including the first gate structure 210 and the first and second impurity regions 202 and 204, and a second transistor including the second gate structure 220 and the third impurity region 206 may be formed on the active region of the substrate 200.

A first insulating interlayer 230 is formed on the substrate 200 to cover the first and second gate structures 210 and 220. The first insulating interlayer 230 may be formed using, for example, an oxide, a nitride and/or an oxynitride. The first insulating interlayer 230 may be formed by, for example, a CVD process, an ALD process, etc. A first plug 235 and a second plug 237 are formed through the first insulating interlayer 230. The first plug 235 is formed on the first impurity region 202, and the second plug 237 is formed on the third impurity region 206. The first and second plugs 235 and 237 may be formed using, for example, a metal and/or a metal nitride. Additionally, another plug (not shown) may be formed on the second impurity region 204, and the plug may be electrically connected to a capacitor (not shown) in a succeeding process.

A bit line 240 is formed on the first insulating interlayer 230 and the first and second plugs 235 and 237. In some embodiments of the present invention, the bit line 240 is formed by forming a metal layer (not shown) including aluminum, tungsten, etc., on the first insulating interlayer 230 and the first and second plugs 235 and 237 and patterning the metal layer. In another embodiment of the present invention, the bit line 240 may be formed by a damascene process. In this case, after performing a heat treatment process, the bit line 240 is formed.

Figure 5B:
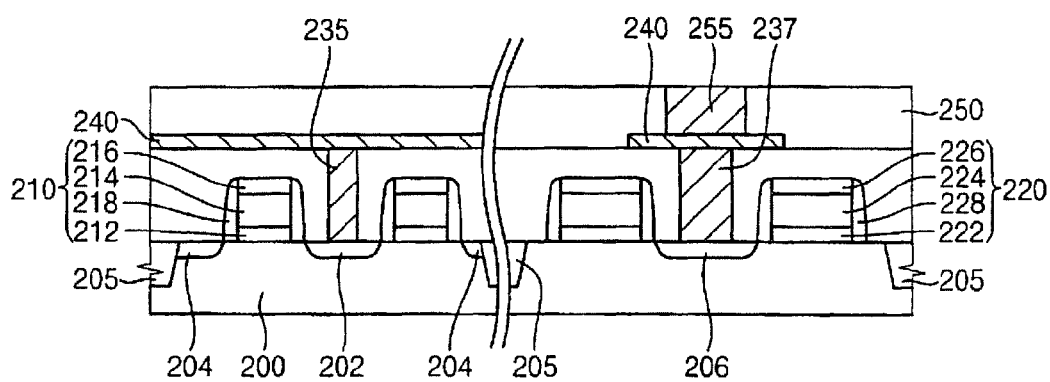

Referring to FIG. 5B, a second insulating interlayer 250 is formed on the first insulating interlayer 230 and the bit line 240. The second insulating interlayer 250 may be formed by, for example, a CVD process or an ALD process using, for example, an oxide, a nitride, and/or an oxynitride. A third plug 255 is formed through the second insulating interlayer 250. The third plug 255 may be formed using, for example, a metal and/or a metal nitride.

Figure 5C:
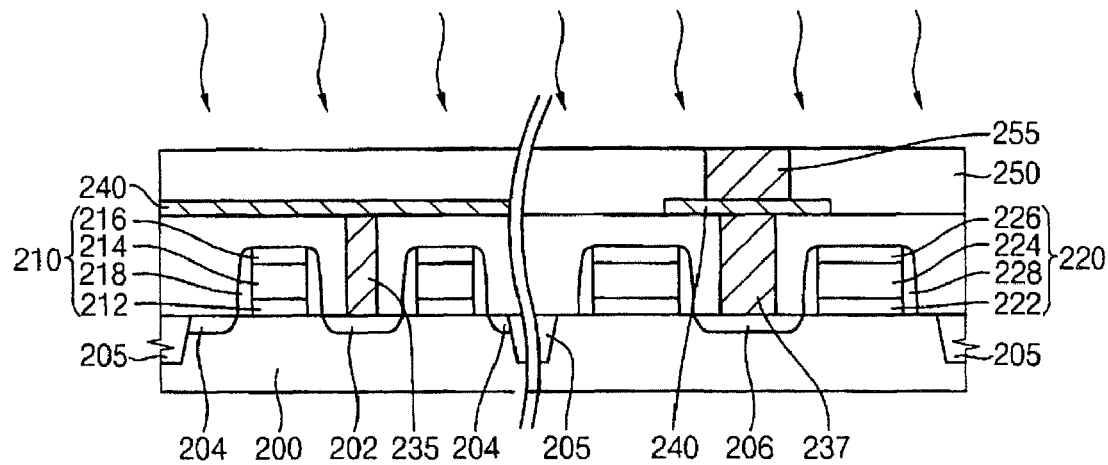

Referring to FIG. 5C, a heat treatment process is performed on the substrate 200 having the gate structures 210 and 220, the insulating interlayers 230 and 250, and the plugs 235, 237 and 255 in an atmosphere of hydrogen gas. The heat treatment process may be performed in an atmosphere of mixed gas including hydrogen gas and an inactive gas, such as nitrogen gas. The heat treatment process may be performed at a temperature of about 200 to about 600° C. for about 1 to 5 hours. Due to the heat treatment process, the dangling bonds of the gate insulation layer patterns 212 and 222 may be cured.

When the heat treatment process is performed, no silicon nitride layer has been formed to prevent hydrogen atoms from moving to the gate insulation layer patterns 212 and 222, and thus the dangling bonds may be sufficiently cured.

Figure 5D:
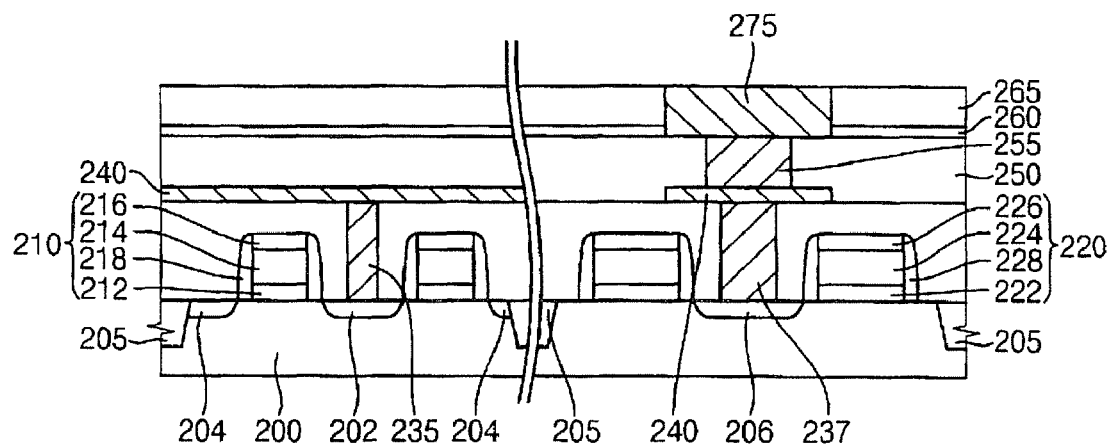

Referring to FIG. 5D, a first etch stop layer 260 and the third insulating interlayer 265 are formed on the second insulating interlayer 250 and the third plug 255. A first metal wiring 275 is formed through the first etch stop layer 260 and the third insulating interlayer 265 by a single damascene process. The first etch stop layer 260 may be formed using, for example, silicon nitride, silicon carbide, silicon oxynitride, silicon oxycarbide, etc. In some embodiments of the present invention, the first etch stop layer 260 is formed using silicon nitride. The third insulating interlayer 265 may be formed using, for example, an oxide, a nitride and/or an oxynitride. In some embodiments of the present invention, the third insulating interlayer 265 is formed using, for example, FSG or TEOS oxide, which has a low dielectric constant. The first metal wiring 275 may be formed using, for example, copper, aluminum, tungsten, etc. In some embodiments of the present invention, the first metal wiring 275 is formed using copper.

Figure 5E:
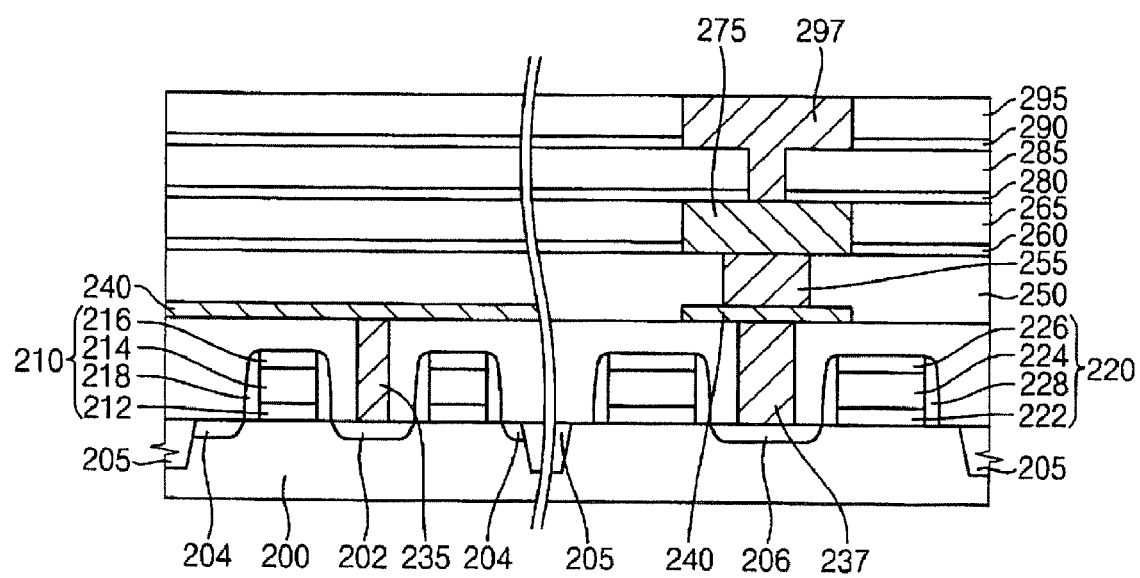

Referring to FIG. 5E, after forming a second etch stop layer 280, a fourth insulating interlayer 285, a third etch stop layer 290 and a fifth insulating interlayer 295 on the third insulating interlayer 265 and the first metal wiring 275, a second metal wiring 297 is formed through the second etch stop layer 280, the fourth insulating interlayer 285, the third etch stop layer 290 and the fifth insulating interlayer 295 by a dual damascene process. The second and third etch stop layers 280 and 290 may be formed using a nitride such as silicon nitride. The fourth and fifth insulating interlayers 285 and 295 may be formed using an oxide having a low dielectric constant such as FSG or TEOS oxide, a nitride and/or an oxynitride. The second metal wiring 297 may be formed using copper.

Alternatively, the first metal wiring 275 may be formed by a dual damascene process, and the second metal wiring 297 may be formed by a single damascene process. Furthermore, one or more than one metal wiring may be formed on the second metal wiring 297 by a single damascene process and/or a dual damascene process.

Meanwhile, an aluminum pad (not shown) may be further formed on the second metal wiring 297, and a passivation layer (not shown) may be further formed on the fifth insulating interlayer 295 and the second metal wiring 297.

By the above processes, the DRAM device in accordance with embodiments of the present invention may be manufactured. The heat treatment process is performed in an atmosphere of hydrogen gas before forming the etch stop layers 260, 280 and 290 including silicon nitride in the damascene process in which the first and second metal wiring 275 and 297 including copper is formed, so that the dangling bonds of the gate insulation layer patterns 212 and 222 may be effectively cured.

FIGS. 6A to 6D are cross-sectional views illustrating operations for manufacturing a semiconductor device in accordance with other embodiments of the present invention. FIGS. 6A to 6D show operations for manufacturing a flash memory device, however, the scope of the present invention is not limited thereto.

Figure 6A:
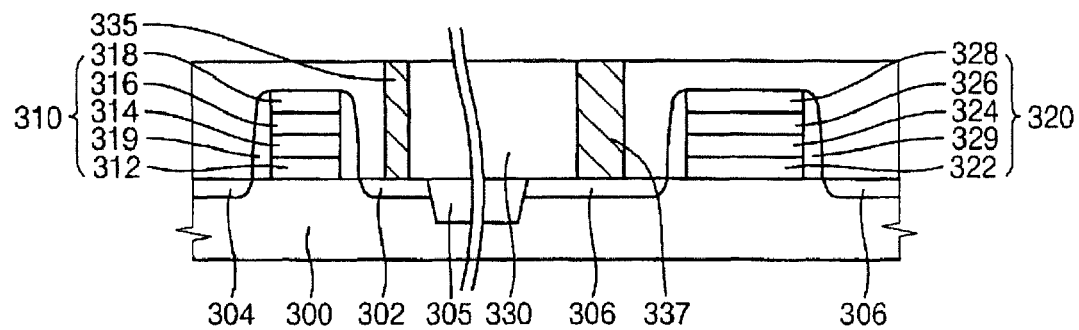
FIGS. 6A to 6D are cross-sectional views illustrating operations for manufacturing a semiconductor device in accordance with still further embodiments of the present invention.

Referring to FIG. 6A, an isolation layer 305 is formed on the substrate 300 by, for example, a STI process or a thermal oxidation process, thereby defining an active region and a field region in the substrate 300. A first gate structure 310 and a second gate structure 320 are formed on the active region of the substrate 300. The first gate structure 310 is formed on a cell region, and the second gate structure 320 is formed on a core/peri region. The first gate structure 310 has a first tunnel insulation layer pattern 312, a first floating gate 314, a first dielectric layer pattern 316, a first control gate 318 and a first gate spacer 319. The second gate structure 320 has a second tunnel insulation layer pattern 322, a second floating gate 324, a second dielectric layer pattern 326, a second control gate 328 and a second gate spacer 329.

The first and second tunnel insulation layer patterns 312 and 322 may be formed on a top surface of the substrate 300 by a thermal oxidation process, and thus may include silicon oxide. In this time, dangling bonds may be formed in the first and second tunnel insulation layer patterns 312 and 322. The first and second floating gates 314 and 324 may be formed using, for example, doped polysilicon. The first and second dielectric layer patterns 316 and 326 may be formed using, for example, a metal oxide. The first and second control gates 318 and 328 may be formed using, for example, a metal and/or a metal nitride. The first and second gate spacers 319 and 329 may be formed using, for example, a nitride such as silicon nitride.

An ion implantation process using the first and second gate structures 310 and 320 as an ion implantation mask may be performed on the substrate 300 to form a first impurity region 302 and a second impurity region 304 at upper portions of the active region adjacent to the first gate structure 310, and a third impurity region 306 at an upper portion of the active region adjacent to the second gate structure 320. Thus, a first transistor including the first gate structure 310 and the first and second impurity regions 302 and 304, and a second transistor including the second gate structure 320 and the third impurity region 306 may be formed on the active region of the substrate 300.

A first insulating interlayer 330 is formed on the substrate 300 to cover the first and second gate structures 310 and 320. The first insulating interlayer 330 may be formed using, for example, an oxide, a nitride and/or an oxynitride. The first insulating interlayer 330 may be formed by, for example, a CVD process, an ALD process, etc. A first plug 335 and a second plug 337 are formed through the first insulating interlayer 330. The first plug 335 is formed on the first impurity region 302, and the second plug 337 is formed on the third impurity region 306. The first and second plugs 335 and 337 may be formed using, for example, a metal and/or a metal nitride. Additionally, a common source line (not shown) may be formed on the second impurity region 304 in a successive process.

Figure 6B:
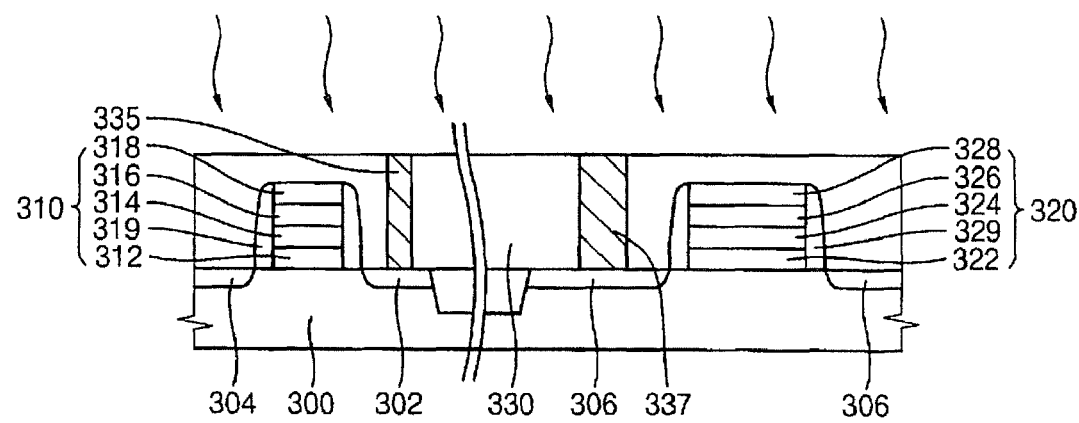

Referring to FIG. 6B, a heat treatment process is performed on the substrate 300 having the gate structures 310 and 320, the first insulating interlayer 330 and the plugs 335 and 337 in an atmosphere of hydrogen gas. The heat treatment process may be performed in an atmosphere of mixed gas including hydrogen gas and an inactive gas, such as nitrogen gas. The heat treatment process may be performed at a temperature of about 200 to about 600° C. for about 1 to 5 hours. Due to the heat treatment process, the dangling bonds of the tunnel insulation layer patterns 312 and 322 may be cured. When the heat treatment process is performed, no silicon nitride layer has been formed to prevent hydrogen atoms from moving to the tunnel insulation layer patterns 312 and 322, and thus the dangling bonds may be sufficiently cured.

Figure 6C:
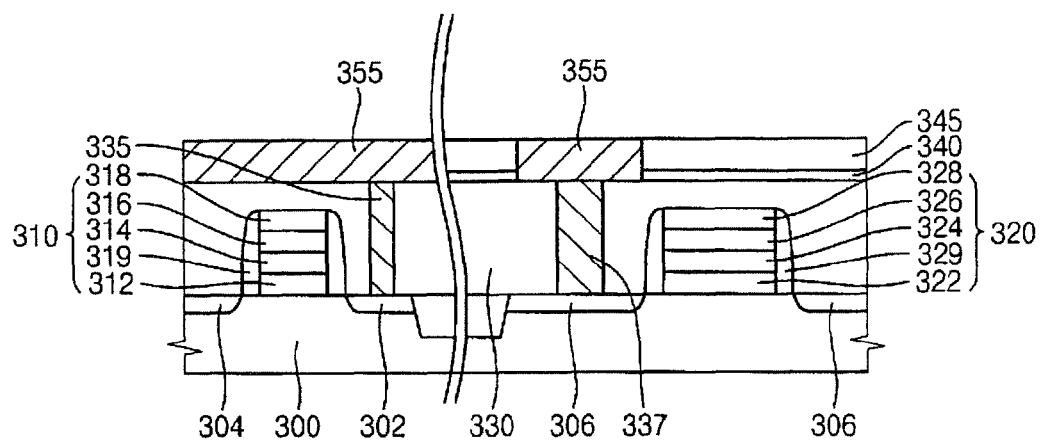

Referring to FIG. 6C, a bit line 335 is formed on the first insulating interlayer 330 and the first and second plugs 335 and 337. In some embodiments of the present invention, the bit line 335 may be formed using, for example, aluminum, tungsten, etc. In some embodiments of the present invention, the bit line 355 is formed by a single damascene process using copper, that is, a first etch stop layer 340 and a second insulating interlayer 345 are formed on the first insulating interlayer 330 and the first and second plugs 335 and 337, and a hole exposing the first and second plugs 335 and 337 is formed through the first etch stop layer 340 and the second insulating interlayer 345. The bit line 355 is formed to fill up the hole. The first etch stop layer 340 may be formed using, for example, a nitride such as silicon nitride, and the second insulating interlayer 345 may be formed using, for example, an oxide having a low dielectric constant such as FSG or TEOS oxide, a nitride and/or an oxynitride.

Figure 6D:
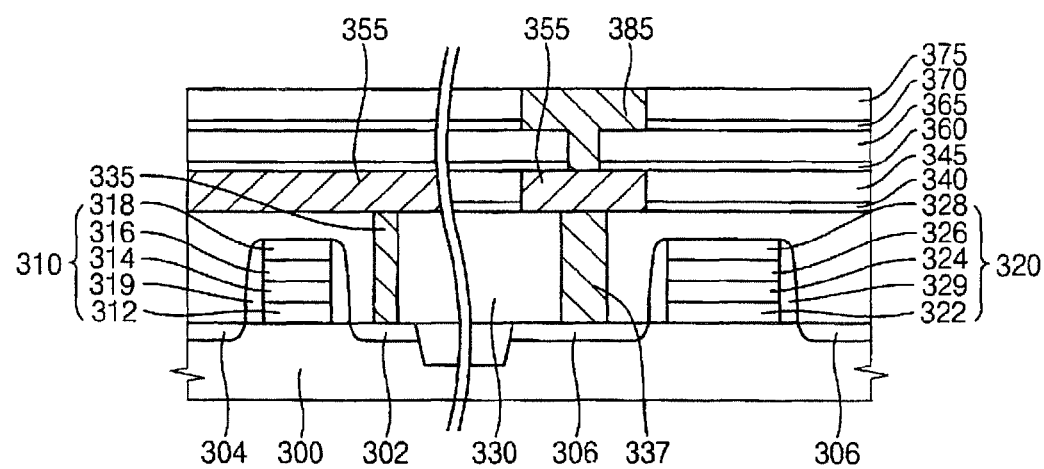

Referring to FIG. 6D, after forming a second etch stop layer 360, a third insulating interlayer 365, a third etch stop layer 370 and a fourth insulating interlayer 375 on the second insulating interlayer 345 and the bit line 355, a metal wiring 385 is formed through the second etch stop layer 360, the third insulating interlayer 365, the third etch stop layer 370 and the fourth insulating interlayer 375 by a dual damascene process. The second and third etch stop layers 360 and 370 may be formed using, for example, a nitride such as silicon nitride. The third and fourth insulating interlayers 365 and 375 may be formed using, for example, an oxide having a low dielectric constant, such as FSG or TEOS oxide, a nitride and/or an oxynitride. The metal wiring 385 may be formed using, for example, copper.

Alternatively, the metal wiring 385 may be formed by a dual damascene process. Additionally, one or more than one metal wiring may be formed on the metal wiring 385 by a single damascene process and/or a dual damascene process. Furthermore, an aluminum pad (not shown) may be formed on the metal wiring 385, and a passivation layer (not shown) may be further formed on the fourth insulating interlayer 375 and the metal wiring 385.

By the above processes, a flash memory device may be formed in accordance with some embodiments of the present invention. The heat treatment process is performed in an atmosphere of hydrogen gas before forming the etch stop layers 340, 360 and 370 including silicon nitride in the damascene process in which the metal wiring 385 including copper is formed, so that the dangling bonds of the tunnel insulation layer patterns 312 and 322 may be effectively cured.

According to some embodiments of the present invention, a heat treatment process is performed in an atmosphere of hydrogen gas before forming a silicon nitride layer serving as an etch stop layer in a damascene process in which a copper wiring is formed. Thus, hydrogen atoms may be prevented from being absorbed by the silicon nitride layer during the heat treatment process, so that the hydrogen atoms may move to the gate insulation layer and dangling bonds of the gate insulation layer may be effectively cured. As a result, a semiconductor device having the gate insulation layer may have an enhanced reliability.

The foregoing is illustrative of the present invention and is not to be construed as limiting thereof. Although a few embodiments of the present invention have been described, those skilled in the art will readily appreciate that many modifications are possible in the embodiments without materially departing from the novel teachings and advantages of the present invention. Accordingly, all such modifications are included within the scope of the present invention as defined in the claims. In the claims, means-plus-function clauses are intended to cover the structures described herein as performing the recited function, as well as structural equivalents and equivalent structures. Therefore, it is to be understood that the foregoing is illustrative of the present invention and is not to be construed as limited to the specific embodiments disclosed, and that modifications to the disclosed embodiments, as well as other embodiments, are within the scope of the appended claims.

What is claimed is:

1. A method of manufacturing a semiconductor device comprising:
    forming a gate structure on a substrate;
    forming an insulating interlayer covering the gate structure;
    heat treating the substrate while exposing a surface of the insulating interlayer to a hydrogen gas atmosphere;
    forming a silicon nitride layer directly on the insulating interlayer after the heat treatment; and
    forming a metal wiring on the insulating interlayer.

2. The method of manufacturing a semiconductor device according to claim 1, wherein the metal wiring comprises copper.

3. The method of manufacturing a semiconductor device according to claim 2, wherein heat treating the substrate while exposing a surface of the interlayer insulating layer to a hydrogen gas atmosphere is preceded by forming a plug through the insulating interlayer that contacts the substrate and wherein the metal wiring is electrically connected to the plug.

4. The method of manufacturing a semiconductor device according to claim 3, wherein the plug comprises tungsten.

5. The method of manufacturing a semiconductor device according to claim 1, wherein heat treating the substrate while exposing a surface of the interlayer insulating layer to a hydrogen gas atmosphere is preceded by forming a plug through the insulating interlayer that contacts the substrate and wherein the metal wiring is electrically connected to the plug.

6. The method of manufacturing a semiconductor device according to claim 5, wherein forming a plug through the insulating interlayer that contacts the substrate comprises:
    forming an opening through the insulating interlayer that exposes the substrate;
    forming a conductive layer on the insulating interlayer and in the opening; and
    planarizing the conductive layer to expose the insulating interlayer.

7. The method of manufacturing a semiconductor device according to claim 6, wherein planarizing the conductive layer comprises a chemical mechanical polishing (CMP) process and/or an etch-back process.

8. The method of manufacturing a semiconductor device according to claim 5:
    wherein forming an insulating interlayer covering the gate structure comprises forming a first insulating interlayer; and
    wherein forming a metal wiring comprises:
        forming a second insulating interlayer directly on the silicon nitride layer;
        forming a hole through the second insulating interlayer and the silicon nitride layer to expose the plug; and
        forming a metal layer in the hole through the second insulating interlayer and the silicon nitride layer.

9. The method of manufacturing a semiconductor device according to claim 8, wherein the second insulating interlayer comprises a low-k material.

10. The method of manufacturing a semiconductor device according to claim 8:
    wherein forming a silicon nitride layer directly on the interlayer insulating layer after the heat treatment comprises forming a first silicon nitride layer directly on the first insulating interlayer after the heat treatment;

wherein forming a second insulating interlayer directly on the silicon nitride layer comprises forming the second insulating interlayer directly on the first silicon nitride layer;

wherein forming a metal layer in the hole through the second insulating interlayer and the silicon nitride layer comprises forming a first metal layer in the hole through the second insulating interlayer and the first silicon nitride layer; and wherein forming a metal wiring further comprises:
 forming a second silicon nitride layer directly on the second insulating interlayer;
 forming a third insulating interlayer directly on the second silicon nitride layer;
 forming a third silicon nitride layer directly on the third insulating interlayer;
 forming a fourth insulating interlayer directly on the third silicon nitride layer;
 forming a hole through the fourth insulating interlayer, the third silicon nitride layer and the third insulating interlayer exposing a portion of the second silicon nitride layer;
 removing a portion of the fourth insulating interlayer to expose a portion of the third silicon nitride layer adjacent the hole;
 removing the exposed portions of the third silicon nitride layer adjacent the hole and the exposed portion of the second silicon nitride layer in the hole to expose a portion of the first metal layer at a bottom of the hole;
 forming a second metal layer on the exposed first metal layer.

11. The method of manufacturing a semiconductor device according to claim 10, the third and fourth insulating interlayers comprise a low-k material.

12. The method of manufacturing a semiconductor device according to claim 1, wherein heat treating the substrate while exposing a surface of the insulating interlayer to a hydrogen gas atmosphere comprises heat treating the substrate while exposing a surface of the insulating interlayer to a mixed atmosphere comprising hydrogen gas and an inactive gas.

13. The method of manufacturing a semiconductor device according to claim 1, further comprising:
 forming a protection layer on the metal wiring; and
 heat treating the substrate while exposing a surface of the protection layer to a hydrogen gas atmosphere.

14. The method of manufacturing a semiconductor device according to claim 13, wherein heat treating the substrate while exposing a surface of the insulating interlayer to a hydrogen gas atmosphere and heat treating the substrate while exposing a surface of the protection layer to a hydrogen gas atmosphere are performed for substantially the same amount of time.

15. The method of manufacturing a semiconductor device according to claim 1, wherein the substrate includes silicon and wherein the gate structure has a gate insulation layer including silicon oxide.

16. The method of manufacturing a semiconductor device according to claim 15, wherein dangling bonds of the gate insulation layer are cured by the heat treating the substrate while exposing a surface of the insulating interlayer to a hydrogen gas atmosphere.

17. The method of manufacturing a semiconductor device according to claim 1, wherein the metal wiring comprises a bit line.

18. The method of manufacturing a semiconductor device according to claim 1, wherein the gate structure comprises a tunnel insulation layer, a floating gate, a dielectric layer and a control gate stacked on the substrate, wherein the substrate comprises silicon, and wherein the tunnel insulation layer comprises silicon oxide.

19. The method of manufacturing a semiconductor device according to claim 18, wherein dangling bonds of the tunnel insulation layer are cured by the heat treating the substrate while exposing a surface of the insulating interlayer to a hydrogen gas atmosphere.

20. A method of manufacturing a semiconductor device comprising:
 forming a gate structure on a substrate;
 forming an insulating interlayer covering the gate structure;
 heat treating the substrate while exposing a surface of the insulating interlayer to a hydrogen gas atmosphere at a temperature of about 200 to about 600° C. for about 1 to 5 hours;
 forming a silicon nitride layer directly on the insulating interlayer after the heat treatment; and
 forming a metal wiring on the insulating interlayer.

* * * * *